United States Patent
Patil et al.

(10) Patent No.: US 11,605,595 B2
(45) Date of Patent: Mar. 14, 2023

(54) PACKAGES WITH LOCAL HIGH-DENSITY ROUTING REGION EMBEDDED WITHIN AN INSULATING LAYER

(71) Applicant: QUALCOMM Incorporated, San Diego, CA (US)

(72) Inventors: Aniket Patil, San Diego, CA (US); Hong Bok We, San Diego, CA (US); Kuiwon Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 56 days.

(21) Appl. No.: 16/994,398

(22) Filed: Aug. 14, 2020

(65) Prior Publication Data
US 2022/0051988 A1    Feb. 17, 2022

(51) Int. Cl.
*H01L 23/538* (2006.01)
*H01L 21/48* (2006.01)

(52) U.S. Cl.
CPC ...... *H01L 23/5386* (2013.01); *H01L 21/4853* (2013.01); *H01L 21/4857* (2013.01); *H01L 23/5383* (2013.01)

(58) Field of Classification Search
CPC ............. H01L 23/5386; H01L 21/4853; H01L 21/4857; H01L 23/5383
See application file for complete search history.

(56) References Cited

U.S. PATENT DOCUMENTS

| | | | |
|---|---|---|---|
| 6,323,436 B1 | 11/2001 | Hedrick et al. | |
| 2014/0264791 A1* | 9/2014 | Manusharow | H01L 23/5383 |
| | | | 438/107 |
| 2015/0179570 A1 | 6/2015 | Marimuthu et al. | |
| 2016/0141234 A1 | 5/2016 | We et al. | |
| 2016/0143137 A1 | 5/2016 | Baek et al. | |
| 2017/0365566 A1 | 12/2017 | Lee et al. | |
| 2018/0053723 A1* | 2/2018 | Hu | H01L 24/16 |
| 2018/0061794 A1 | 3/2018 | Kim et al. | |
| 2018/0102311 A1* | 4/2018 | Shih | H01L 23/49827 |
| 2018/0226350 A1* | 8/2018 | Lee | H01L 23/3114 |
| 2019/0287904 A1* | 9/2019 | Seidemann | H01L 25/0652 |
| 2020/0020624 A1* | 1/2020 | Kang | H01L 23/49833 |
| 2021/0183773 A1* | 6/2021 | Rubin | H01L 24/81 |
| 2021/0384130 A1 | 12/2021 | Cheah et al. | |
| 2021/0407962 A1* | 12/2021 | Kim | H01L 23/5384 |

FOREIGN PATENT DOCUMENTS

CN    103987198 A  *  8/2014

OTHER PUBLICATIONS

International Search Report and Written Opinion—PCT/US2021/037221—ISA/EPO—dated Oct. 7, 2021.

* cited by examiner

*Primary Examiner* — Selim U Ahmed
*Assistant Examiner* — Evan G Clinton
(74) *Attorney, Agent, or Firm* — Muncy, Geissler, Olds & Lowe, P.C.

(57) ABSTRACT

Disclosed is an apparatus and methods for making same. The apparatus includes a first insulating layer, a first metal layer disposed on a surface of the first insulating layer, and a metallization structure embedded in the first insulating layer. The metallization structure occupies only a portion of a volume of the first insulating layer. The metallization structure has a line density greater than a line density of the first metal layer.

50 Claims, 7 Drawing Sheets

PACKAGES WITH LOCAL HIGH-DENSITY ROUTING REGION EMBEDDED WITHIN AN INSULATING LAYER

FIELD OF DISCLOSURE

This disclosure relates generally to package devices, and more specifically, but not exclusively, to laminate substrate packages with local, high-density routing regions embedded within an insulating layer and fabrication techniques thereof.

BACKGROUND

Integrated circuit technology has achieved great strides in advancing computing power through miniaturization of active components. There is a constant demand for chipsets that are faster, more capable, and higher performance, yet with smaller and smaller packaging sizes. One packaging solution has been to use so-called "flip-chip" devices, in which a chip is directly mounted pad-side-down onto a laminate substrate rather than being mounted in a package that uses wire bonds to make electrical connections. However, conventional laminate substrates have large feature sizes compared to the feature sizes possible at chip scales. Thus, the relatively large minimum feature sizes of laminate substrates limit the extent to which the size of chipset packages can be reduced. For example, the term "line density" refers to the number of conductive traces that can occupy a given area. Having a greater line density means having a greater number of conductive traces within that given area. Laminate substrates have a relatively large minimum line width (width of the metal trace) and line pitch (distance from line center-to-center), which limits the line density on the laminate substrate. Likewise, the term "feature density" refers to the number of features, such as lines and vias, that can occupy a given area. Laminate substrates have a relatively large minimum via size (e.g., via diameter) and offset (space between the via and another feature), which, together with the relatively large minimum line width and pitch, limits the feature density on the laminate substrate.

Accordingly, there is a need for methods, systems, and apparatus that overcome the deficiencies of conventional laminate substrate packages including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In accordance with the various aspects disclosed herein, at least one aspect includes an apparatus including: a first insulating layer; a first metal layer disposed on a surface of the first insulating layer; and a metallization structure embedded in the first insulating layer; where the metallization structure occupies only a portion of a volume of the first insulating layer and where the metallization structure has a line density greater than a line density of the first metal layer.

In accordance with the various aspects disclosed herein, at least one aspect includes, a method for fabricating an apparatus, the method including: providing a first insulating layer; providing a first metal layer disposed on a surface of the first insulating layer; and providing a metallization structure embedded in the first insulating layer, the metallization structure occupying only a portion of a volume of the first insulating layer and the metallization structure having a line density greater than a line density of the first metal layer.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
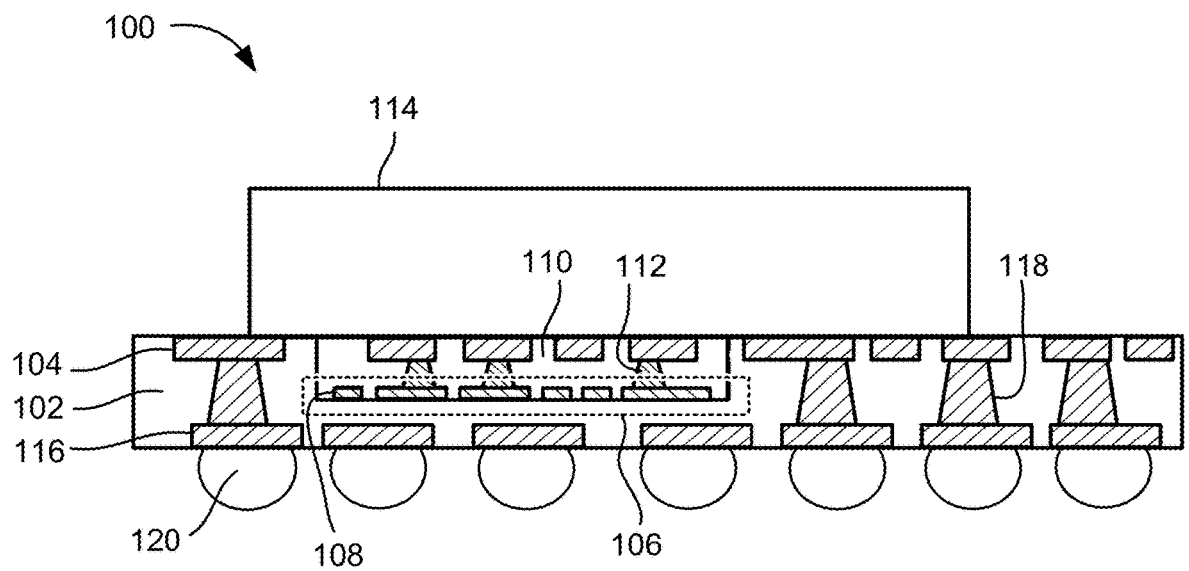
FIG. 1 illustrates an exemplary apparatus according to one or more aspects of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

FIG. 1 illustrates an exemplary apparatus according to one or more aspects of the disclosure. In FIG. 1, apparatus 100 includes a first insulating layer 102 and a first metal layer 104 disposed on a surface of the first insulating layer 102. In some examples, the first insulating layer 102 may undergo a physical or chemical removal process before disposing the first metal layer 104 onto the first insulating layer 102. With the aid of such a removal process, at least a portion of the first metal layer 104 may be flush with the surface of the first insulating layer 102. According to some aspects, the first insulating layer 102 (and, optionally, the first metal layer 104 disposed thereon) are part of a pre-preg (PPG) layer, e.g. a layer formed of pre-impregnated glass, carbon, composite, or other fibers. A metallization structure 106 is embedded in the first insulating layer 102. In some examples, the first insulating layer 102 may also undergo a physical or chemical removal process before embedding the metallization structure 106. With the aid of such a removal process, the metallization structure 106 may be embedded flush with or below the surface of the first insulating layer 102. The metallization structure 106 occupies only a portion of the volume of the first insulating layer 102. The metallization structure 106, more particularly, second metal layer 108 has a line density greater than a line density of the first metal layer 104. Again, having a greater line density means having a greater number of conductive traces within that given area. According to some aspects, the metallization structure 106 may be electrically coupled to at least a portion of the first metal layer 104. In some cases, the metallization structure 106 may be electrically coupled to another portion of the first metal layer 104 which is disposed on the metallization structure 106. In some examples, the portion of the first metal layer 104 disposed on the first insulation layer 102 and the portion of the first metal layer 104 disposed on the metallization structure 106 are flush with each other. According to some aspects, the metallization structure 106 includes a redistribution layer (RDL) or other structure constructed using a wafer process. According to some aspects, the metallization structure 106 comprises a second metal layer 108 not located on a surface of the first insulating layer 102, e.g., not on an external surface of apparatus 100, or put differently, at a location different from the surface onto which the first metal layer 104 is disposed. According to some aspects, the metallization structure 106 includes a photo-imageable dielectric (PID) 110 or other insulating material, which may be different from the material used for the first insulating layer 102. A PID 110 includes photo sensitive dielectric material that remains on the product after the process. In some aspects, the PID 110 is disposed to support the second metal layer 108. In some aspects, the PID 110 is also disposed to at least in part form a surface which is flush with a surface of the first insulating layer 102, e.g. an external surface of apparatus 100. In some cases, the PID 110 or other insulating material is provided between second metal layer 108 and a portion of the first metal layer 104 disposed on the surface of the PID 110. According to some aspects, the second metal layer 108 is electrically coupled to the first metal layer 104 by one or more vias 112 through the PID 110. It is noted that when an entity is described herein as being electrically coupled to a metal layer, it is understood that the entity is coupled to at least a portion of the metal layer.

Apparatus 100 provides several technical advantages, including but not limited to the following. Building up certain regions within a conventional laminate substrate, such as a core substrate and/or a pre-preg (PPG) layer, and embedding therein a metallization structure having a higher line density and/or feature density, such as an RDL, enables higher-density routing and electrical connections than is provided by conventional laminate substrates. For example, a typical PPG substrate may have a minimum line width and line spacing of 100 or more micrometers (μm), while a typical RDL may have a minimum line width and line spacing of 15 μm, which allows RDLs to have up to six times more routing traces per given area (i.e., six times higher line density) than PPG substrates. These measurements and numbers are for illustration only and are not intended to limit the scope of the claims, and furthermore illustrate the point that the metallization structure 106 has a line density greater than the line density of the first metal layer 104.

Such metallization structure 106 facilitating local regions of high-density routing can be embedded in different forms within the first insulating layer 102, possibly formed as PPG substrate. For instance, such local regions of compact high-density routing may be located within one or in-between multiple PPG layers, and may also be stacked upon other local regions of compact routing to form a stacked metallization structure 106. The use of local, high-density routing regions provide technical advantages including, but not limited to: easing local routing congestion; allowing for the design of a more compact package; and providing performance improvements due to reduced routing distances and/or view vias as well as performance improvements due to reduced parasitic resistance, capacitance, or inductance.

According to some aspects, such as the aspect illustrated in FIG. 1, the apparatus 100 may include a die 114 electrically coupled to at least a portion of the first metal layer 104 of the apparatus 100 and/or the metallization structure 106, and a set of electrical contacts 116 electrically coupled to the first metal layer 104 of the apparatus 100 via one or more vias 118 through the first insulating layer 102. According to some aspects, the electrical contacts 116 may include solder ball, Cu-pillar, or under-bump metallization structures 120. According to some aspects, the die 114 is electrically coupled to the first metal layer 104 and/or the metallization structure 106 via a fine-pitch UBM structure. According to some aspects, the metallization structure 106 is located under at least a portion of the die 114. According to some aspects, the die 114 is electrically coupled to the metallization structure 106 via an under-bump metallization (UBM) structure. According to some aspects, the metallization structure 106 is, or includes, a UBM structure.

Figure 2:
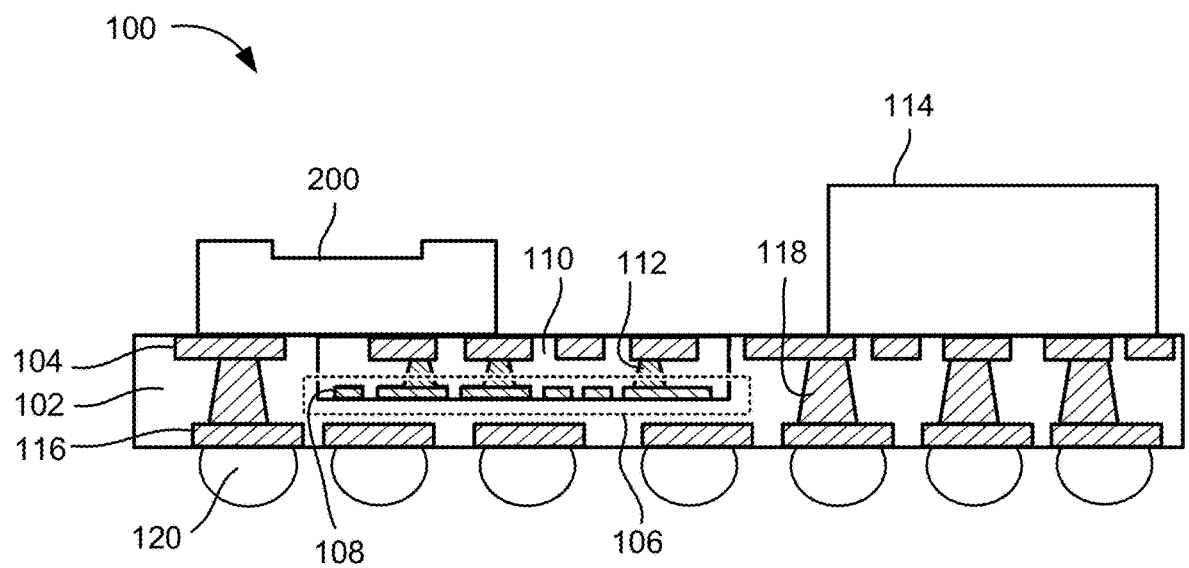
FIG. 2 illustrates another exemplary apparatus according to one or more aspects of the disclosure.

FIG. 2 illustrates an exemplary apparatus according to another aspect of the disclosure. Some elements within FIG. 2 correspond to like-numbered elements within FIG. 1, the descriptions of which will not be repeated here. In the aspect illustrated in FIG. 2, an apparatus, such as apparatus 100 illustrated in FIG. 1, may also include a passive component 200 electrically coupled to at least a portion of the first metal layer 104 and/or the metallization structure 106.

Figure 3:
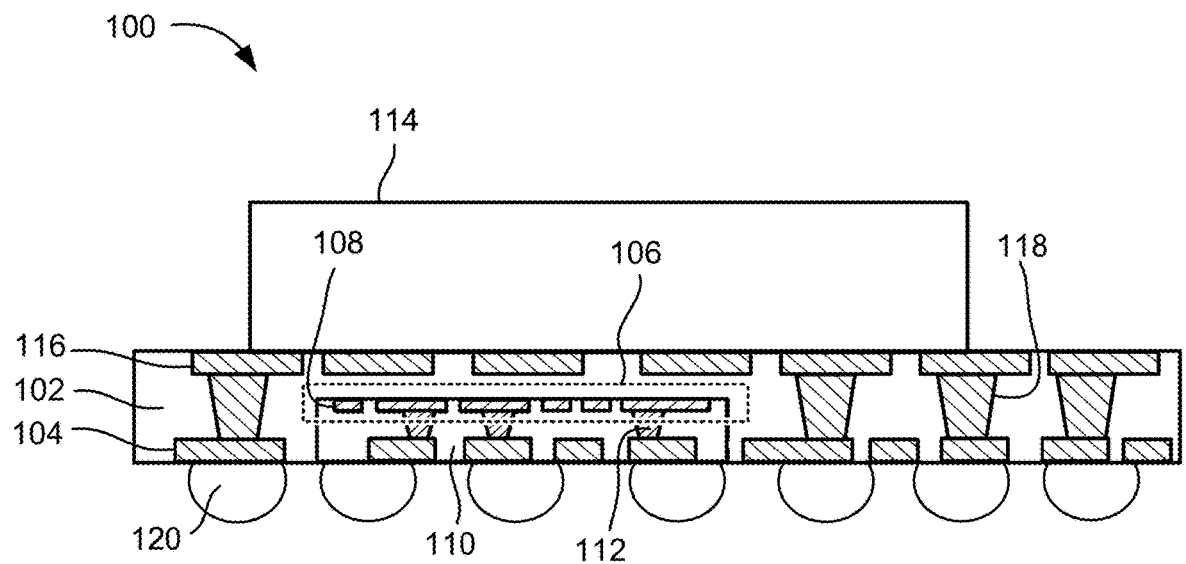
FIG. 3 illustrates another exemplary apparatus according to one or more aspects of the disclosure.

FIG. 3 illustrates an exemplary apparatus according to another aspect of the disclosure. Some elements within FIG. 3 correspond to like-numbered elements within FIG. 1, the descriptions of which will not be repeated here. In the aspect illustrated in FIG. 3, an apparatus, such as apparatus 100 illustrated in FIG. 1, may include a die 114 electrically coupled to at least some of the electrical contacts 116, and may be further electrically coupled to at least a portion of the first metal layer 104 by one or more vias 118 through the first insulating layer 102. The apparatus 100 includes on the opposite surface of the first insulating layer 102 one or more electrical contacts 116 electrically coupled to the at least a portion of the first metal layer 104 and/or to the metallization structure 106. According to some aspects, the metallization structure 106 is located under at least a portion of the one or more electrical contacts 116. According to some aspects, portions of the first metal layer 104 may include solder ball, Cu-pillar, or under-bump metallization structures 120.

Figure 4:
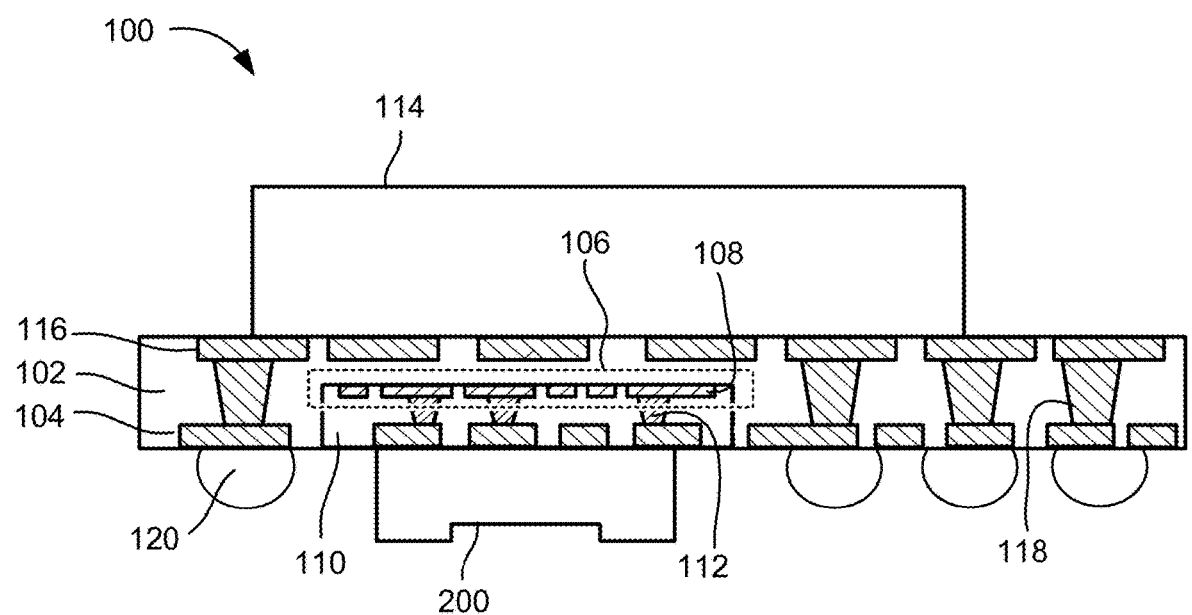
FIG. 4 illustrates another exemplary apparatus according to one or more aspects of the disclosure.

FIG. 4 illustrates an exemplary apparatus according to another aspect of the disclosure. Some elements within FIG. 4 correspond to like-numbered elements within FIGS. 1-3, the descriptions of which will not be repeated here. In the aspect illustrated in FIG. 4, an apparatus, such as apparatus 100 in FIG. 1, may also include a passive component 200 electrically coupled to at least a portion of the first metal layer 104 and/or the metallization structure 106.

Figure 5:
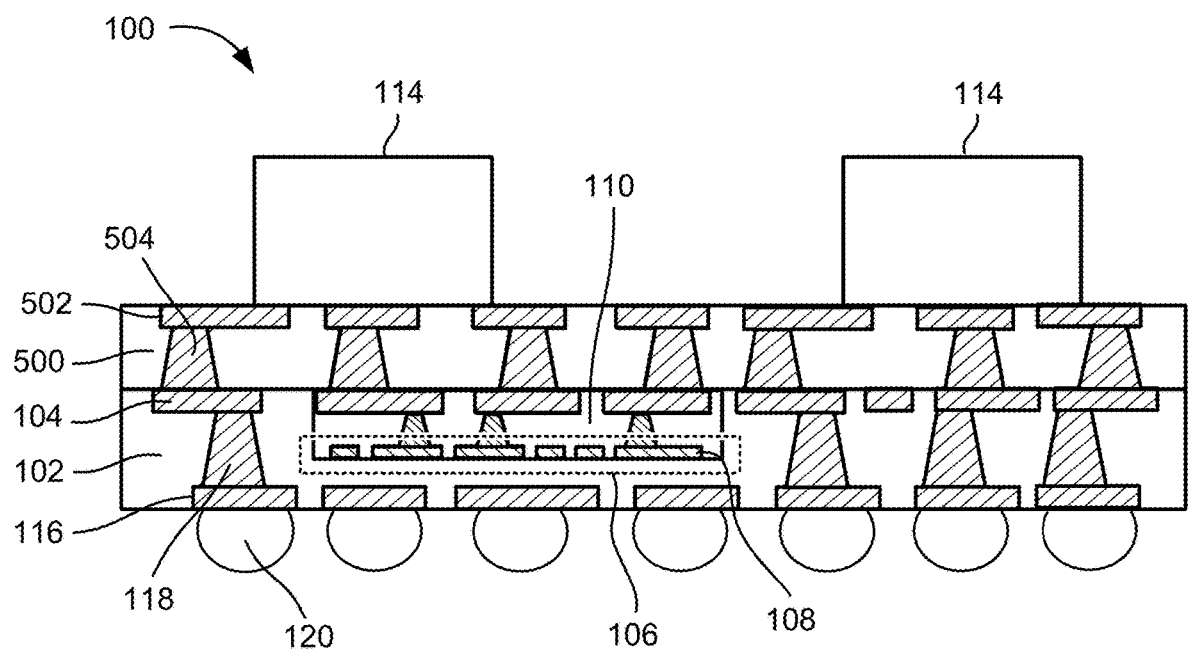
FIG. 5 illustrates another exemplary apparatus according to one or more aspects of the disclosure.
Figure 6:
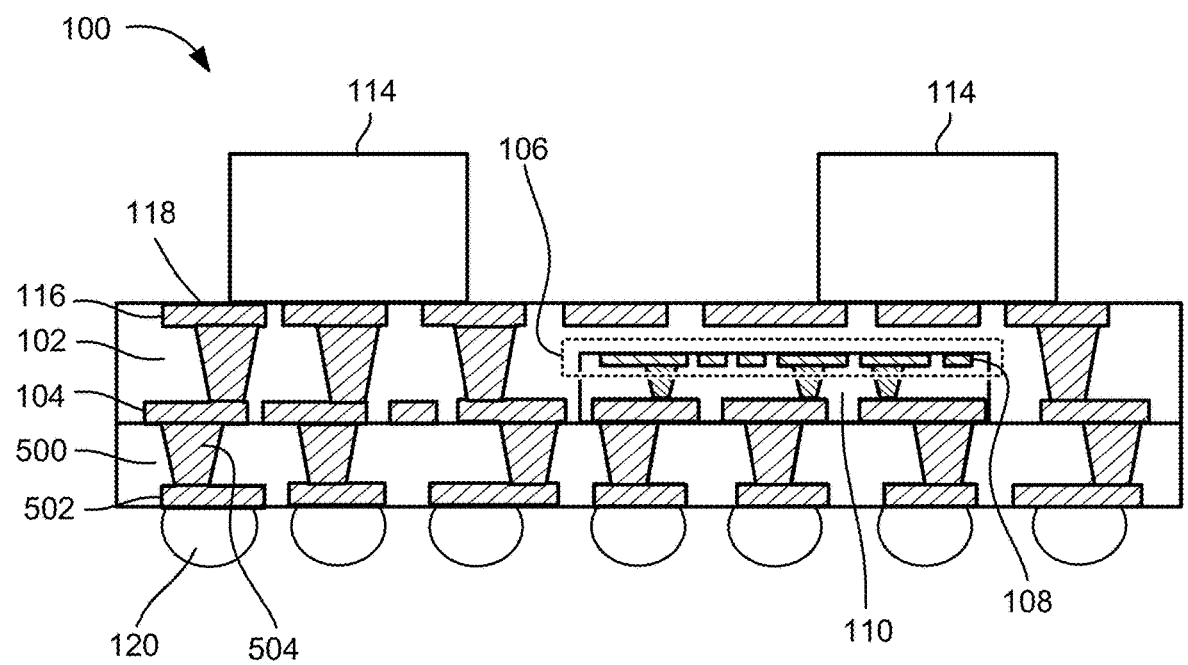
FIG. 6 illustrates another exemplary apparatus according to one or more aspects of the disclosure.

FIGS. 5 and 6 illustrate exemplary apparatuses according to other aspects of the disclosure. Some elements within FIGS. 5 and 6 correspond to like-numbered elements within FIG. 1, the descriptions of which will not be repeated here. In the aspects illustrated in FIGS. 5 and 6, an apparatus, such as apparatus 100, such as apparatus 100 illustrated in FIG. 1, may further include a second insulating layer 500, having a third metal layer 502 electrically coupled to the at least a portion of the first metal layer 104—by one or more vias 504 through the second insulating layer 500. According to some aspects, the metallization structure 106 covers only a portion of an area of the second insulating layer 500. According to some aspects, at least one of the first insulating layer 102 and the second insulating layer 500 are pre-preg (PPG) layers. Thus, in the resulting structures shown in FIGS. 5 and 6, the high-density routing region—i.e., metallization structure 106 embedded within the first insulating layer 102—is in the middle, for instance, in-between multiple PPG layers that make up the apparatus 100 and is therefore hidden from view.

According to some aspects, as illustrated in FIG. 5, the apparatus 100 includes a die 114 electrically coupled to at least a portion of the third metal layer 502. The third metal layer 502 is electrically coupled by one or more vias 506 to the at least a portion of the first metal layer 104. At least a portion of the first metal layer 104 is electrically coupled to one or more electrical contacts 116 by one or more vias 118 through the first insulating layer 102. According to some aspects, the electrical contacts 116 may include solder ball, Cu-pillar, or under-bump metallization structures 120. According to some aspects, the metallization structure 106 is disposed between the electrical contacts 116 and at least a portion of the first metal layer 104. According to some aspects, the local high density area is processed in the middle of a three-layer (3L) embedded trace substrate (ETS).

According to some aspects, as illustrated in FIG. 6, an apparatus, such as the apparatus 100 in FIG. 1, includes a die 114 electrically coupled to the at least some of the electrical contacts 116. At least a some of the electrical contacts 116 are electrically coupled by one or more vias 118 through the first insulating layer 102 to the at least a portion of the first metal layer 104. At least a portion of the first metal layer 104 is electrically coupled by one or more vias 504 to the third metal layer 502. According to some aspects, portions of the third metal layer 502 may include solder ball, Cu-pillar, or under-bump metallization structures 120. According to some aspects, at least a portion of the third metal layer 502 is electrically coupled to one or more electrical contacts 116. According to some aspects, the metallization structure 106 is disposed between the die 114 and the at least a portion of the first metal layer 104. According to some aspects, the local high density area is processed in the middle of a 3-layer ETS.

According to some aspects, the apparatus 100 is incorporated into another apparatus, such as but not limited to one of the following: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle In order to fully illustrate aspects of the design of the present disclosure, methods of fabrication are presented. Other methods of fabrication are possible, and the discussed fabrication methods are presented only to aid understanding of the concepts disclosed herein.

Figure 7:
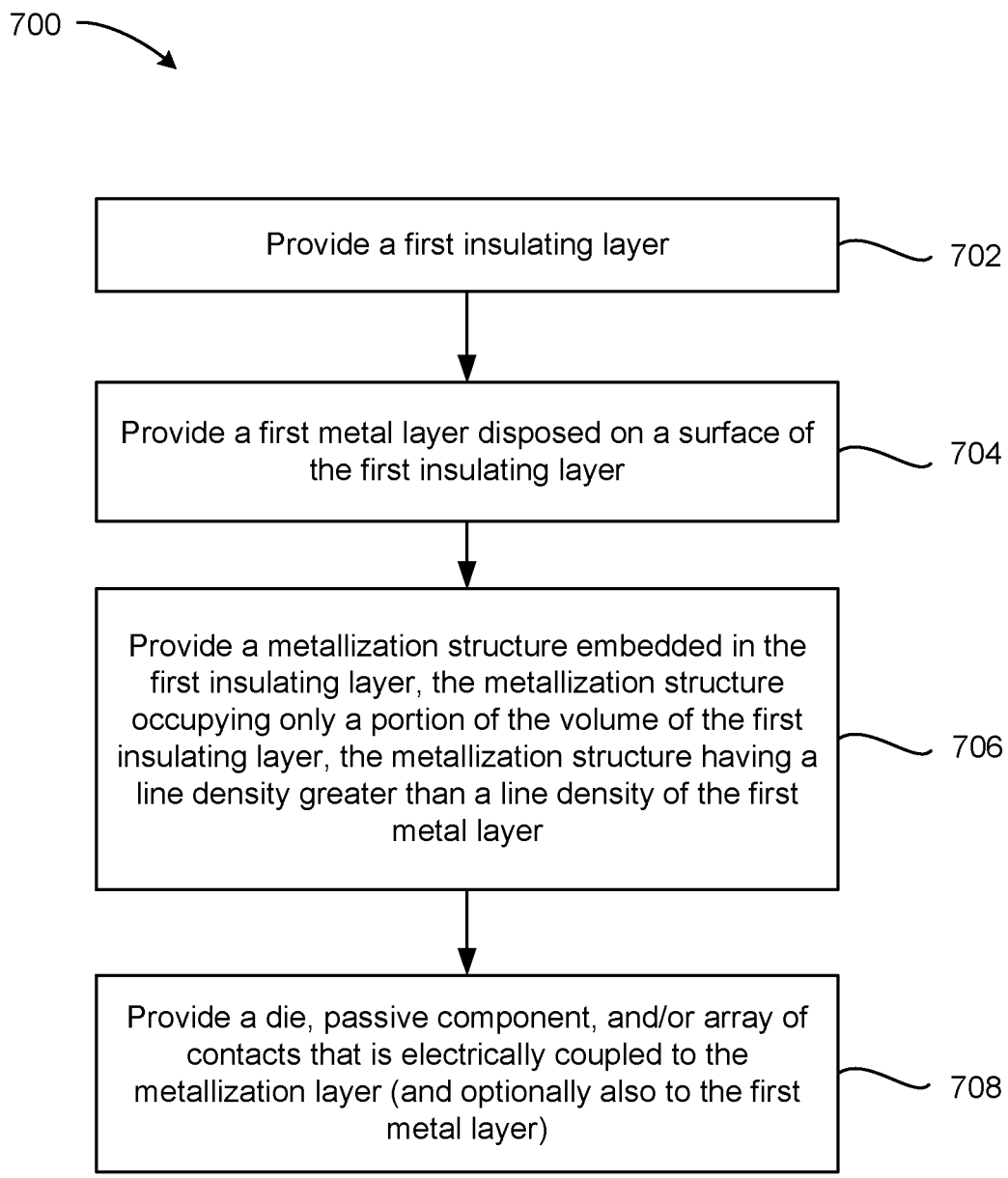
FIG. 7 illustrates a flowchart of an exemplary partial method for manufacturing an apparatus according to one or more aspects of the disclosure.

FIG. 7 illustrates a flowchart of an exemplary partial method 700 for manufacturing an apparatus in accordance with some examples of the disclosure. As shown in FIG. 7, the partial method 700 may begin in block 702 with providing a first insulating layer 102. The partial method 700 may continue in block 704 with providing a first metal layer, e.g. at least a portion of the first metal layer 104 disposed on a surface of the first insulating layer 102. In some examples, the first insulating layer 102 may undergo a physical or chemical removal process before disposing the first metal layer onto the first insulating layer 102. With the aid of such a removal process, the metal layer may be deposited flush with the surface of the first insulating layer 102. The partial method 700 may continue in block 706 with providing a metallization structure 106 embedded in the first insulating layer 102, the metallization structure 106 occupying only a portion of a volume (or a portion of the surface) of the first insulating layer 102. In some examples, the first insulating layer 102 may also undergo a physical or chemical removal process before embedding the metallization structure 106. With the aid of such a removal process, the metallization structure 106 may be embedded flush with the surface of the first insulating layer 102.

In some examples, the first metal layer 104 may be deposited on a temporary substrate and a PID 110 may be deposited onto, and partially covering, the first metal layer 104. The PID forms a first portion of the first insulating layer 102. Another insulating material may be deposited or grown over portions of the first metal layer 104 not already covered by the PID 110. The PID 110 is etched to expose portions of the first metal layer 104, and the metallization structure 106 is deposited onto the PID 110. The other insulating material is removed, leaving the metallization structure 106 and portions of the first metal layer 104 not covered by the PID 110. Another insulating material is formed over the metallization structure 106 and at least some of the exposed first metal layer 104, to complete the first insulating layer 102.

The metallization structure 106 has a line density greater than a line density of the first metal layer 104. The partial method 700 may continue in block 708 with providing a die 114, a passive component 200, and/or a set of electrical contacts 116, electrically coupled to the metallization structure 106 and which may also be electrically coupled to at least a portion of the first metal layer 104.

Figure 8:
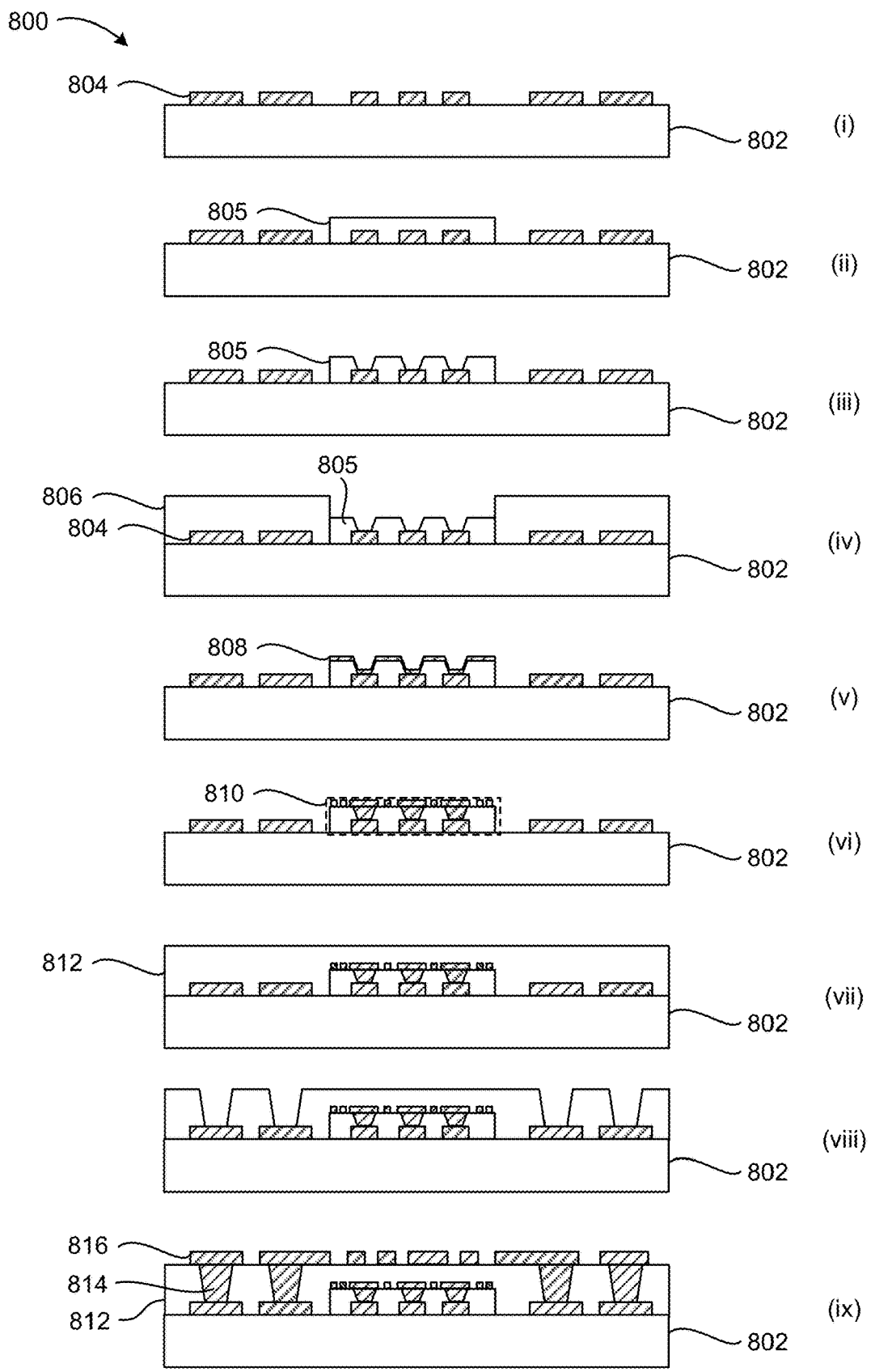
FIG. 8 illustrates fabrication techniques in accordance with one or more aspects of the disclosure.

FIG. 8 illustrates fabrication techniques in accordance with one or more aspects of the disclosure. Referring to FIG. 8, in a partial process 800 portion (i), a substrate 802 is provided, with a first metal layer 804. In process portion (ii), a photo-imageable dielectric (PID) 805 is created in a local region of the substrate 802. In process portion (iii), the PID 805 is etched to create openings in the PID 805 for access to some of the first metal layer 804 features. In process portion (iv), a photoresist (PR) coat 806 is deposited and etched to provide access to the PID 805 and some first metal layer 804 features. In process portion (v), a seed layer 808 of metal is created on an exposed surface of the PID 805 and first metal layer 804 features, after which the PR coat 806 is stripped. In process portion (vi), a metallization structure 810 is created using multiple steps, such as may be used to create a redistribution layer (RDL), e.g., photomask (PM) coat, expose, and develop, seed deposit, plating, stripping, etching, and so on. The metallization structure 810 is electrically coupled to at least some of the features or structures of the first metal layer 804. In process portion (vii), an insulating layer 812 is built up over the metallization structure 810. The insulating layer 812 may be a PPG layer, e.g., fiberglass impregnated with uncured resin. In some aspects, the PPG layer is placed on top of the first metal layer 801 and the metallization structure 810, while flexible then cured once the resin has flowed or been forced into place covering those structures. In process portion (viii), openings are created in the insulating layer 812 for access to some of the features or structures of the first metal layer 804. In process portion (ix), vias 814 and metal patterning 816 are created, e.g., using copper.

It will be appreciated that if the substrate 802 is an insulating layer with vias through it to provide electrical connections to the opposite side, the resulting structure in FIG. 8 is like that illustrated in FIGS. 5 and 6. Likewise, if the substrate 802 shown in FIG. 8 is finally removed, the resulting structure is like those illustrated in FIGS. 1 through 4. Also, it will be appreciated that the structures shown in FIGS. 1 through 8 may be enhanced by the creation of additional insulating layers and metal layers.

It will be appreciated that the foregoing fabrication process was provided merely as general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations.

Figure 9:
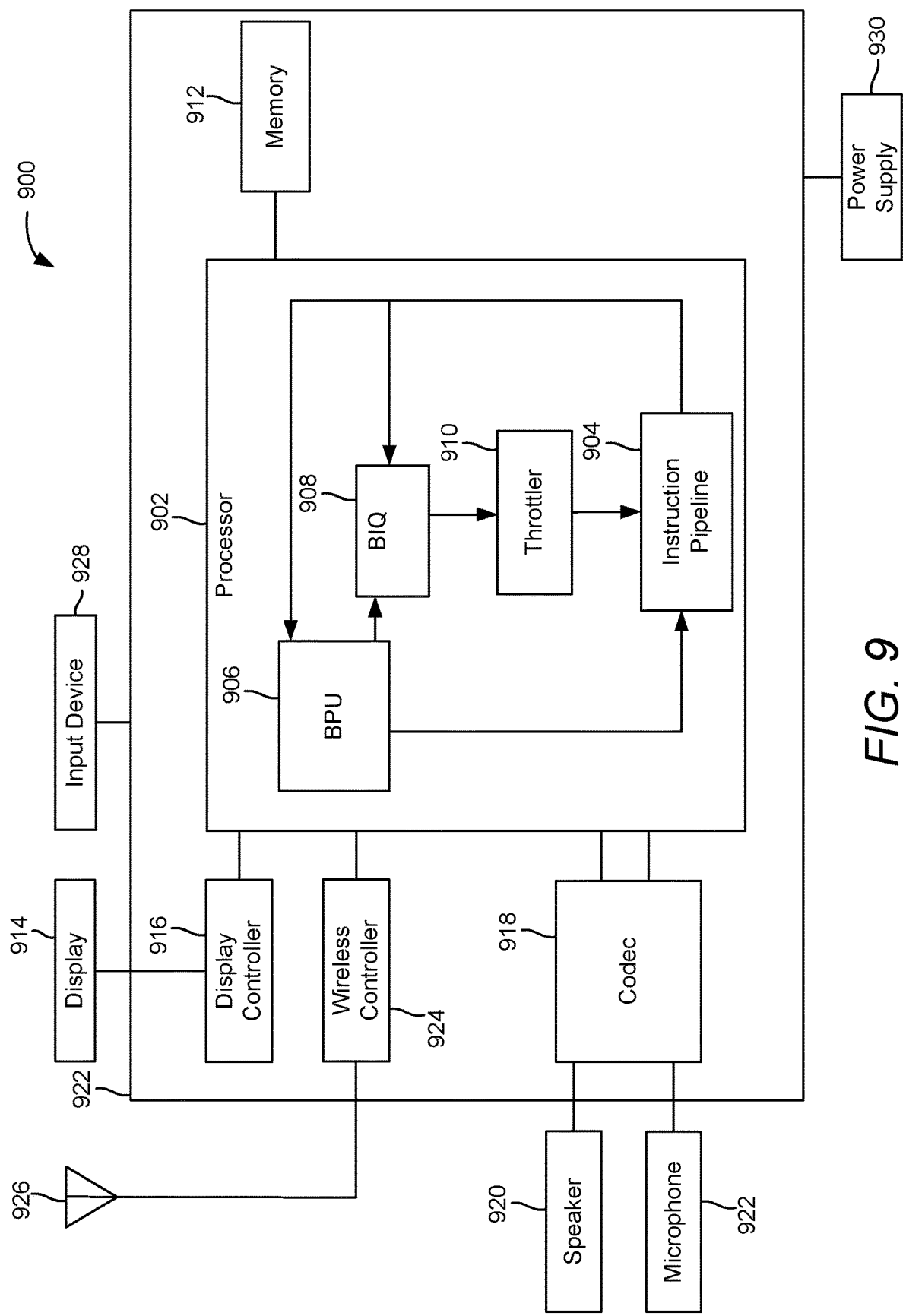
FIG. 9 illustrates an exemplary mobile device in accordance with one or more aspects of the disclosure.

FIG. 9 illustrates an exemplary mobile device in accordance with some examples of the disclosure. Referring now to FIG. 9, a block diagram of a mobile device that is configured according to exemplary aspects is depicted and generally designated mobile device 900. In some aspects, mobile device 900 may be configured as a wireless communication device. As shown, mobile device 900 includes processor 902. Processor 902 is shown to comprise instruction pipeline 904, buffer processing unit (BPU) 906, branch instruction queue (BIQ) 908, and throttler 910 as is well known in the art. Other well-known details (e.g., counters, entries, confidence fields, weighted sum, comparator, etc.) of these blocks have been omitted from this view of processor 902 for the sake of clarity. Processor 902 may be communicatively coupled to memory 912 over a link, which may be a die-to-die or chip-to-chip link. Mobile device 900 also includes display 914 and display controller 916, with display controller 916 coupled to processor 902 and to display 914.

In some aspects, FIG. 9 may include coder/decoder (CODEC) 918 (e.g., an audio and/or voice CODEC) coupled to processor 902; speaker 920 and microphone 922 coupled to CODEC 918; and wireless controller circuits 924 (which may include a modem, radio frequency (RF) circuitry, filters, etc., which may be implemented using one or more flip-chip devices, as disclosed herein) coupled to wireless antenna 926 and to processor 902.

In a particular aspect, where one or more of the above-mentioned blocks are present, processor 902, display controller 916, memory 912, CODEC 918, and wireless controller circuits 924 can be included in a system-in-package or system-on-chip device, including but not limited to apparatuses 100 and 800, which may be implemented in whole or part using the techniques disclosed herein. Input device 928 (e.g., physical or virtual keyboard), power supply 930 (e.g., battery), display 914, input device 928, speaker 920, microphone 922, wireless antenna 926, and power supply 930 may be external to the system-on-chip device and may be coupled to a component of the system-on-chip device, such as an interface or a controller.

It should be noted that although FIG. 9 depicts a mobile device, the processor 902 and memory 912 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 10:
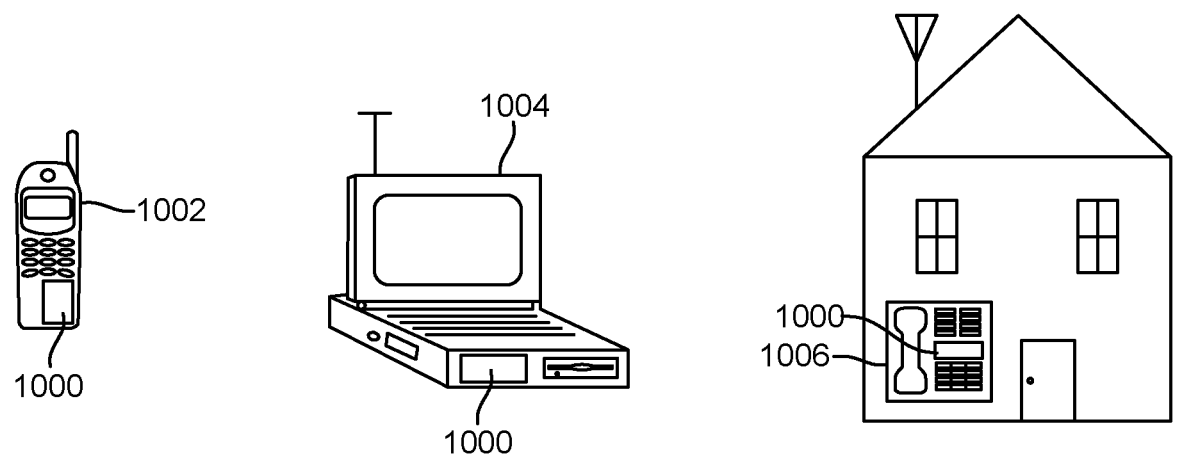
FIG. 10 illustrates various electronic devices that may be integrated with any of the aforementioned integrated device or semiconductor device in accordance with one or more aspects of the disclosure.

FIG. 10 illustrates various electronic devices that may be integrated with any of the aforementioned integrated device or semiconductor device accordance with various examples of the disclosure. For example, a mobile phone device 1002, a laptop computer device 1004, and a fixed location terminal device 1006 may each be considered generally user equipment (UE) and may include a device 1000 as described herein, for example. The device may be, for example, any of the integrated circuits, dies, integrated devices, integrated device packages, integrated circuit devices, device packages, integrated circuit (IC) packages, package-on-package devices described herein. The mobile phone device 1002, laptop computer device 1004, and fixed location terminal device 1006 illustrated in FIG. 10 are merely exemplary. Other electronic devices may also feature device including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed packages, devices, and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into a flip-chip or other package. The packages may then be employed in devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-10 may be rearranged and/or combined into a single component, process, feature or function or incorporated in several components, processes, or functions. Additional elements, components, processes, and/or functions may also be added without departing from the disclosure. It should also be noted that FIGS. 1-10 and corresponding description in the present disclosure are not limited to dies and/or ICs. In some implementations, FIGS. 1-10 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, an Internet of thing (IoT) device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), wideband CDMA (W-CDMA), time division multiple access (TDMA), frequency division multiple access (FDMA), Orthogonal Frequency Division Multiplexing (OFDM), Global System for Mobile Communications (GSM), Third Generation Partnership Project (3GPP) Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An apparatus comprising:
a pre-preg (PPG) first insulating layer comprising a bottom surface and a top surface;
a first metal layer disposed on the top surface of the first insulating layer and having first features having a first line density; and
a metallization structure embedded in the first insulating layer and comprising a second metal layer that is separated from the first metal layer by a non-PPG second insulating layer, the second metal layer having second features having a second line density greater than the first line density,
wherein the metallization structure occupies only a portion of a volume of the first insulating layer, wherein the second features are positioned within a plane located between the top surface of the first insulating layer and the bottom surface of the first insulating layer, and wherein the second metal layer is electrically coupled to at least a portion of the first metal layer by at least one via through the non-PPG second insulating layer separating the second metal layer from the first metal layer.

2. The apparatus of claim 1, wherein the metallization structure comprises a redistribution layer.

3. The apparatus of claim 1, wherein the second insulating layer comprises a photo-imageable dielectric (PID).

4. The apparatus of claim 1, wherein a top surface of the second insulating layer is flush with the top surface of the first insulating layer.

5. The apparatus of claim 1, wherein the second metal layer is electrically coupled to the at least a portion of the first metal layer disposed on the top surface of the second insulating layer by the at least one via through the second insulating layer.

6. The apparatus of claim 1, further comprising:
a die electrically coupled to at least a portion of the first metal layer; and
a plurality of electrical contacts electrically coupled to at least a portion of the first metal layer by a plurality of vias through the first insulating layer.

7. The apparatus of claim 6, wherein at least some of the plurality of electrical contacts comprise a solder ball, Cu-pillar, or under-bump metallization (UBM) structure.

8. The apparatus of claim 6, wherein the die is electrically coupled to the at least a portion of the first metal layer by an under-bump metallization (UBM) structure.

9. The apparatus of claim 6, wherein the die is electrically coupled to the metallization structure.

10. The apparatus of claim 6, wherein the metallization structure is disposed under at least a portion of the die.

11. The apparatus of claim 6, further comprising a passive component electrically coupled to the at least a portion of the first metal layer.

12. The apparatus of claim 11 wherein the passive component is electrically coupled to at least a portion of the metallization structure.

13. The apparatus of claim 1, further comprising:
a die electrically coupled to at least a portion of the first metal layer by a plurality of vias through the first insulating layer; and
a plurality of electrical contacts electrically coupled to at least a portion of the first metal layer.

14. The apparatus of claim 13, wherein at least some of the electrical contacts comprise a solder ball, Cu-pillar, or under-bump metallization (UBM) structure.

15. The apparatus of claim 13, wherein at least a portion of the plurality of electrical contacts is electrically coupled to the metallization structure.

16. The apparatus of claim 13, wherein the metallization structure is disposed under at least a portion of the plurality of electrical contacts.

17. The apparatus of claim 13, further comprising a passive component electrically coupled to the metallization structure.

18. The apparatus of claim 13, wherein at least a portion of the first metal layer comprises a solder ball, Cu-pillar, or under-bump metallization (UBM) structure.

19. The apparatus of claim 1, further comprising:
a second insulating layer; and
a third metal layer disposed on a surface of the second insulating layer, the third metal layer electrically coupled to at least a portion of the first metal layer by one or more vias through the second insulating layer.

20. The apparatus of claim 19, wherein the metallization structure covers only a portion of an area of the second insulating layer.

21. The apparatus of claim 19, further comprising:
a die electrically coupled to at least a portion of the third metal layer; and
a plurality of electrical contacts electrically coupled to at least a portion of the first metal layer by a plurality of vias through the first insulating layer.

22. The apparatus of claim 21, wherein at least some of the plurality of electrical contacts comprise a solder ball, Cu-pillar, or under-bump metallization (UBM) structure.

23. The apparatus of claim 19, further comprising:
a die electrically coupled to at least a portion of the first metal layer by a plurality of vias through the first insulating layer; and
a plurality of electrical contacts electrically coupled to the third metal layer.

24. The apparatus of claim 23, wherein at least some of the plurality of electrical contacts comprise a solder ball, Cu-pillar, or under-bump metallization (UBM) structure.

25. The apparatus of claim 1, wherein the apparatus is incorporated into another apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

26. The apparatus of claim 1, wherein the apparatus comprises a package.

27. A method for fabricating an apparatus, the method comprising:
providing an insulating substrate;
depositing a first metal layer on a surface of the insulating substrate;
etching the first metal layer to create first features having a first line density; and
providing a metallization structure embedded in a pre-preg (PPG) first insulating layer disposed on the insulating substrate, the first insulating layer comprising a top surface and a bottom surface, the metallization structure comprising a second metal layer that is separated from the first metal layer by a non-PPG second insulating layer, the second metal layer having second features having a second line density greater than the first line density, the metallization structure occupying only a portion of a volume of the first insulating layer, the second features occupying a plane located between the top surface of the first insulating layer and the bottom surface of the first insulating layer, and the second metal layer being electrically coupled to at least a portion of the first metal layer by at least one via through the non-PPG second insulating layer separating the second metal layer from the first metal layer, wherein providing the metallization structure comprises:
depositing, as the non-PPG second insulating layer, a photo-imageable dielectric (PID) on a first region of the insulating substrate and covering and in direct contact with the at least a portion of the first metal layer;
etching the PID to create openings in the PID for access to at least a portion of the first metal layer covered by the PID;
depositing a photoresist (PR) coat on the PID and the at least a portion of the first metal layer;
etching the PR coat to provide access to the PID and the at least a portion of the first metal layer;
depositing the second metal layer on the PID and the at least a portion of the first metal layer;
etching the second metal layer to create second features having a second line density greater than the first line density;
removing the PR coat; and
providing the PPG first insulating layer disposed on and in direct contact with the first features and the second features.

28. The method of claim 27, wherein providing the metallization structure comprises providing a redistribution layer.

29. The method of claim 27, further comprising:
etching the first insulating layer to provide access to at least some of the first features; and
providing metal connections having the first line density to the at least some of the first features and to at least one of the second features.

30. The method of claim 29, wherein providing the metal connections having the first line density to the at least some of the first features and to at least one of the second features comprises providing copper connections, providing at least one metal connection through at least one via through the PID, or a combination thereof.

31. The method of claim 27, further comprising:
incorporating a die into the apparatus, the die being electrically coupled to at least a portion of the first metal layer, and a plurality of electrical contacts electrically coupled to at least a portion of the first metal layer by a plurality of vias through the first insulating layer.

32. The method of claim 31, wherein at least some of the plurality of electrical contacts comprise a solder ball, Cu-pillar, or under-bump metallization (UBM) structure.

33. The method of claim 31, wherein the die is electrically coupled to the at least a portion of the first metal layer by an under-bump metallization (UBM) structure.

34. The method of claim 31, wherein the die is electrically coupled to the metallization structure.

35. The method of claim 31, wherein the metallization structure is disposed under at least a portion of the die.

36. The method of claim 31, the apparatus further comprising a passive component electrically coupled to at least a portion of the first metal layer.

37. The method of claim 36, wherein the passive component is electrically coupled to at least a portion of the metallization structure.

38. The method of claim 27, further comprising:
incorporating a die into the apparatus, the die electrically coupled to at least a portion of the first metal layer by a plurality of vias through the first insulating layer, and a plurality of electrical contacts electrically coupled to at least a portion of the first metal layer.

39. The method of claim 38, wherein at least some of the plurality of electrical contacts comprise a solder ball, Cu-pillar, or under-bump metallization (UBM) structure.

40. The method of claim 38, wherein at least a portion of the plurality of electrical contacts is electrically coupled to the metallization structure.

41. The method of claim 38, wherein the metallization structure is disposed under at least a portion of the plurality of electrical contacts.

42. The method of claim 38, further comprising providing a passive component electrically coupled to the metallization structure.

43. The method of claim 38, wherein at least a portion of the first metal layer comprises a solder ball, Cu-pillar, or under-bump metallization (UBM) structure.

44. The method of claim 27, further comprising:
providing a second insulating layer having a third metal layer electrically coupled to at least a portion of the first metal layer by one or more vias through the second insulating layer.

45. The method of claim 44, wherein the metallization structure covers only a portion of an area of the second insulating layer.

46. The method of claim 44, further comprising:
incorporating a die into the apparatus, the die electrically coupled to at least a portion of the third metal layer; and
providing a plurality of electrical contacts electrically coupled to at least a portion of the first metal layer by a plurality of vias through the first insulating layer.

47. The method of claim 46, wherein at least some of the plurality of electrical contacts comprise a solder ball, Cu-pillar, or under-bump metallization (UBM) structure.

48. The method of claim 44, further comprising:
incorporating a die into the apparatus, the die electrically coupled to at least a portion of the first metal layer by a plurality of vias through the first insulating layer, and a plurality of electrical contacts electrically coupled to the third metal layer.

49. The method of claim 48, wherein at least some of the plurality of electrical contacts comprise a solder ball, Cu-pillar, or under-bump metallization (UBM) structure.

50. The method of claim 27, further comprising:
incorporating the apparatus into another apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

* * * * *